United States Patent
Boegner et al.

(10) Patent No.: US 10,448,542 B2
(45) Date of Patent: *Oct. 15, 2019

(54) SERVER RACK-DEDICATED VERTICAL VORTEX AIRFLOW SERVER COOLING

(71) Applicant: International Business Machines Corporation, Armonk, NY (US)

(72) Inventors: Marc D. Boegner, Morgan Hill, CA (US); Dario D'Angelo, Los Gatos, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 543 days.

This patent is subject to a terminal disclaimer.

(21) Appl. No.: 14/719,740

(22) Filed: May 22, 2015

(65) Prior Publication Data

US 2016/0120073 A1 Apr. 28, 2016

Related U.S. Application Data

(63) Continuation of application No. 14/524,851, filed on Oct. 27, 2014, now Pat. No. 9,588,526.

(51) Int. Cl.
*G05B 15/02* (2006.01)
*H05K 7/20* (2006.01)
(Continued)

(52) U.S. Cl.
CPC ....... *H05K 7/20736* (2013.01); *F04D 19/002* (2013.01); *F04D 27/004* (2013.01);
(Continued)

(58) Field of Classification Search
CPC . G05D 23/1917; F04D 19/002; F04D 27/004; H05K 7/20718; H05K 7/20736; H05K 7/20745
See application file for complete search history.

(56) References Cited

U.S. PATENT DOCUMENTS

| | | | |
|---|---|---|---|
| 6,977,587 B2 * | 12/2005 | Pradhan | G01S 5/0289 340/539.1 |
| 7,272,945 B2 | 9/2007 | Bash et al. | |

(Continued)

OTHER PUBLICATIONS

United States Patent and Trademark Office, Notice of Allowance for U.S. Appl. No. 14/524,851, dated Oct. 26, 2016, pp. 1-18, Alexandria, VA, USA.

(Continued)

*Primary Examiner* — Brian W Wathen
*Assistant Examiner* — Brian T McMenemy
(74) *Attorney, Agent, or Firm* — Lee Law, PLLC; Christopher B. Lee

(57) ABSTRACT

A vortex-producing fan controller uses a variable-speed vortex-producing fan to create a helical airflow within a server rack that couples with cooled air entering a data center through a floor opening situated near a bottom of the server rack and that draws the cooled air up through the server rack in a helical pattern. An input air temperature of air entering the variable-speed vortex-producing fan is measured using readings from a fan input air temperature sensor positioned above the server rack. A speed of the variable-speed vortex-producing fan and a flow rate of the cooled air coupled within the helical airflow up through the server rack are adjusted responsive to changes in the input air temperature of the air entering the variable-speed vortex-producing fan.

7 Claims, 5 Drawing Sheets

(51) Int. Cl.
*F04D 19/00* (2006.01)
*F04D 27/00* (2006.01)
*G05D 23/19* (2006.01)
*G05D 7/06* (2006.01)
*G05D 13/62* (2006.01)
*G05D 27/02* (2006.01)

(52) U.S. Cl.
CPC .......... *G05B 15/02* (2013.01); *G05D 7/0623* (2013.01); *G05D 13/62* (2013.01); *G05D 23/1917* (2013.01); *G05D 27/02* (2013.01); *H05K 7/20718* (2013.01); *H05K 7/20745* (2013.01)

(56) References Cited

U.S. PATENT DOCUMENTS

| | | | |
|---|---|---|---|
| 7,574,283 B2 | 8/2009 | Wang et al. | |
| 8,157,626 B2 | 4/2012 | Day | |
| 8,739,540 B2 | 6/2014 | McCutchen et al. | |
| 9,588,526 B2 | 3/2017 | Boegner et al. | |
| 9,974,211 B2 | 5/2018 | Boegner et al. | |
| 2004/0107718 A1 | 6/2004 | Bowman et al. | |
| 2009/0207564 A1 | 8/2009 | Campbell et al. | |
| 2009/0255653 A1* | 10/2009 | Mills | H05K 7/20736 165/104.34 |
| 2010/0064714 A1 | 3/2010 | Tashiro | |
| 2010/0252233 A1 | 10/2010 | Absalom | |
| 2010/0263825 A1* | 10/2010 | Noteboom | H05K 7/20736 165/47 |
| 2011/0046812 A1* | 2/2011 | Hansen | G06F 1/206 700/300 |
| 2011/0060471 A1 | 3/2011 | Aggus et al. | |
| 2011/0303406 A1 | 12/2011 | Takeda et al. | |
| 2013/0267160 A1* | 10/2013 | Hung | H05K 7/20736 454/184 |
| 2014/0046489 A1 | 2/2014 | Geissler et al. | |
| 2016/0037686 A1* | 2/2016 | Shabbir | G06F 1/206 700/300 |

OTHER PUBLICATIONS

IBM, List of IBM Patents or Patent Applications Treated as Related, Applicant Appendix, Jan. 25, 2017, pp. 1-2, the contents of which are incorporated herein by reference in their entirety.

IBM, List of IBM Patents or Patent Applications Treated as Related, Applicant Appendix, Jun. 16, 2015, pp. 1-2, the contents of which are incorporated herein by reference in their entirety.

United States Patent and Trademark Office, Notice of Allowance for U.S. Appl. No. 15/415,253, dated Dec. 1, 2017, pp. 1-9, Alexandria, VA, USA.

United States Patent and Trademark Office, Office Action for U.S. Appl. No. 15/415,253, dated Aug. 15, 2017, pp. 1-12, Alexandria, VA, USA.

Examiner, United States Patent and Trademark Office, Corrected Notice of Allowance for U.S. Appl. No. 15/415,253 dated Apr. 13, 2018, pp. 1-6, Alexandria, VA, USA.

IBM, List of IBM Patents or Patent Applications Treated as Related, Applicant Appendix, Jul. 5, 2018 pp. 1-2, the contents of which are incorporated herein by reference in their entirety.

United States Patent and Trademark Office, Notice of Allowance for U.S. Appl. No. 15/908,316, dated Jul. 17, 2018, pp. 1-19, Alexandria, VA, USA.

\* cited by examiner

SERVER RACK-DEDICATED VERTICAL VORTEX AIRFLOW SERVER COOLING

BACKGROUND

The present invention relates to temperature controls in data centers. More particularly, the present invention relates to server rack-dedicated vertical vortex airflow server cooling.

Data centers arrange data servers in server racks. Server racks may be oriented into rows within data centers to ease access to the servers. Pairs of rows of server racks may be arranged such that the backs of two rows of server racks face each other. Additional pairs of server rows may be situated essentially in parallel with one another.

BRIEF SUMMARY

A method includes creating, by a vortex-producing fan controller using a variable-speed vortex-producing fan, a helical airflow within a server rack that couples with cooled air entering a data center through a floor opening situated near a bottom of the server rack and that draws the cooled air up through the server rack in a helical pattern; measuring, using readings from a fan input air temperature sensor positioned above the server rack, an input air temperature of air entering the variable-speed vortex-producing fan; and adjusting, responsive to changes in the input air temperature of the air entering the variable-speed vortex-producing fan, a speed of the variable-speed vortex-producing fan and a flow rate of the cooled air coupled within the helical airflow up through the server rack.

A system includes a fan input air temperature sensor positioned above a server rack; and a processor of a vortex-producing fan controller programmed to: create, using a variable-speed vortex-producing fan, a helical airflow within the server rack that couples with cooled air entering a data center through a floor opening situated near a bottom of the server rack and that draws the cooled air up through the server rack in a helical pattern; measure, using readings from the fan input air temperature sensor positioned above the server rack, an input air temperature of air entering the variable-speed vortex-producing fan; and adjust, responsive to changes in the input air temperature of the air entering the variable-speed vortex-producing fan, a speed of the variable-speed vortex-producing fan and a flow rate of the cooled air coupled with the helical airflow up through the server rack.

A computer program product includes a computer readable storage medium having computer readable program code embodied therewith, where the computer readable program code when executed on a computer causes the computer to: create, using a variable-speed vortex-producing fan, a helical airflow within a server rack that couples with cooled air entering a data center through a floor opening situated near a bottom of the server rack and that draws the cooled air up through the server rack in a helical pattern; measure, using readings from a fan input air temperature sensor positioned above the server rack, an input air temperature of air entering the variable-speed vortex-producing fan; and adjust, responsive to changes in the input air temperature of the air entering the variable-speed vortex-producing fan, a speed of the variable-speed vortex-producing fan and a flow rate of the cooled air coupled within the helical airflow up through the server rack.

DETAILED DESCRIPTION

Figure 1:
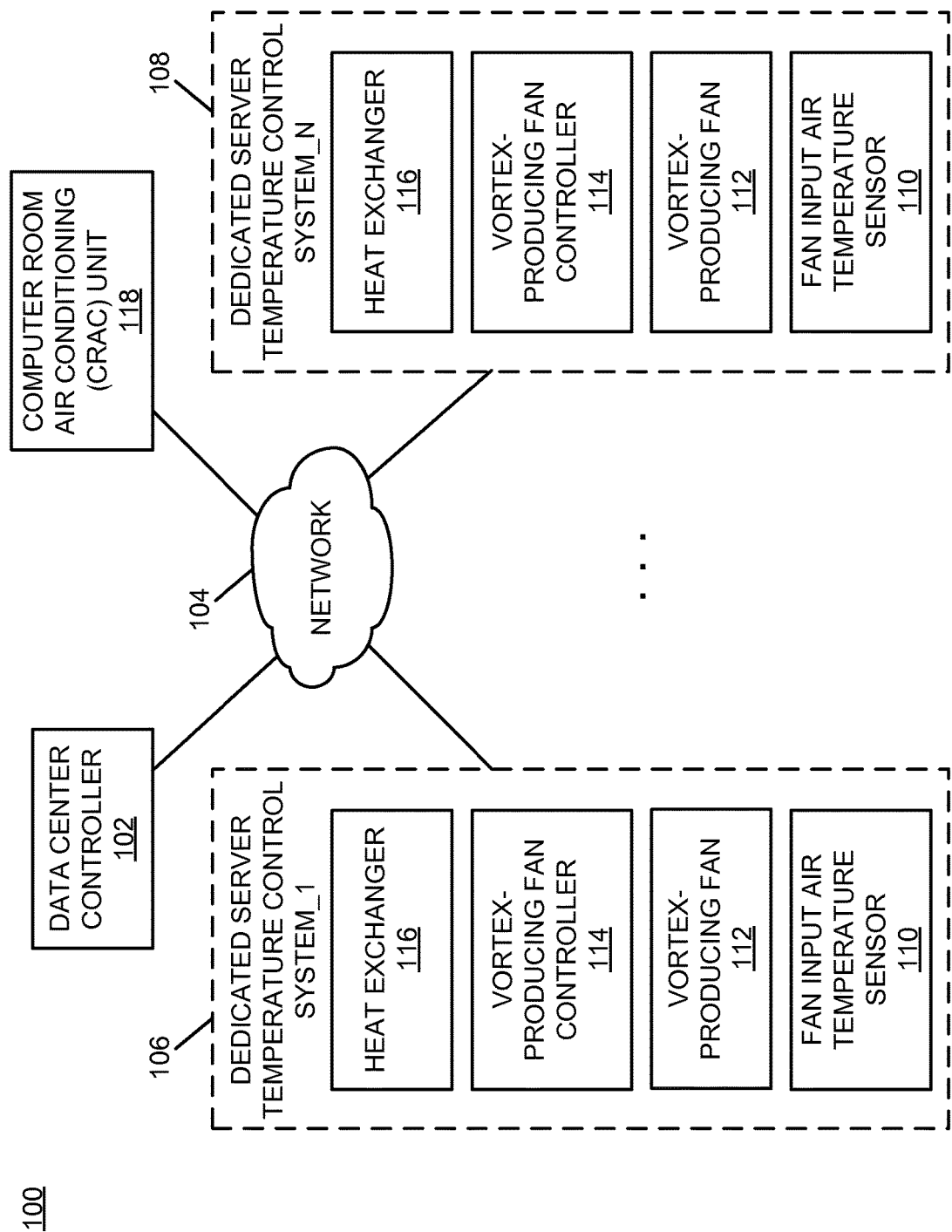
FIG. 1 is a block diagram of an example of an implementation of a system for server rack-dedicated vertical vortex airflow server cooling according to an embodiment of the present subject matter.

The examples set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The subject matter described herein provides server rack-dedicated vertical vortex airflow server cooling. The present technology imposes a dedicated negative air pressure and heat extracting airflow above a given server rack that couples with a dedicated positive air pressure cooling airflow near the bottom of the server rack. A variable-speed vortex producing fan placed in a location of a ceiling tile above a server rack creates the dedicated negative air pressure above the server rack and induces a vortex into the coupled positive air pressure cooling airflow. The positive air pressure cooling airflow may be forced under pressure by an air conditioning unit through a floor tile positioned within a suspended floor of the data center near the bottom of the server rack. The vortex-coupled air streams form a rotating laminar airflow that is physically drawn around the servers and upward through the rack to create a rack-dedicated heat extraction mechanism. Temperature sensors located below the fan where the air enters the fan air intake above the server rack are used to control adjustable fan speed/air extraction capabilities, and thereby adjust the temperature of the server rack. As a result, cooling for each server rack may be individually and programmatically controlled with a dedicated temperature control system.

As described in more detail below, the rack-dedicated heat extraction mechanism may further improve a flowrate of the vertical directional focus of heated air that is generated by servers in a server rack, increase a rate of removal of the heated air from both the server rack and from the data center, and diminish temperature gradients across hot/cold isles. A laminar airflow or streamline airflow in parallel layers, without disruption between the layers may be controlled and passed through a server rack in a dedicated manner, while increasing data center air velocities and without lateral mixing of laminar vertical air streams. The rack-dedicated nature of the laminar airflows with increased velocities may further reduce cross currents that would otherwise flow perpendicular to the induced vertical direction of flow, and as a further result may reduce eddy currents or swirls of air above or between the server racks. Warm air may be extracted directly from the top of the server rack. The cooling of the server rack is performed in a vertical plane from the floor to ceiling via the vortex-coupled negative and positive airflows. As such, individual/different cooling needs of individual server racks due to differences in heat production of different quantities of servers may be individually adjusted. Additionally, the present technology may reduce the volume of chaotic warm air dispersion in the data center environment, and may further reduce air temperature/pressure fluctuations within the data center.

The technology described herein may improve efficiency of data center heat extraction. The vortex-producing heat-extracting fans my further improve synergy with the data center cooling air blown from the perforated tiles of the subfloor. It should be additionally noted that the present technology provides more warm air availability above the drop-down ceiling in a data center, and this warm air may be re-used by passage through additional heat-exchanger units to provide heated air for offices or other building environments. Further, less warm air is dispersed chaotically in the data center environment, which may reduce the effects of micro-climates that would otherwise unpredictably affect the cooling of a given rack, and may achieve more predictable temperatures in critical data center locations. Air temperature/pressure fluctuations may also be reduced in conjunction with greater control and predictability of overall data center temperatures.

Additionally, because of the improvement in rack cooling efficiency, the present technology may further reduce power consumed by the many data center heating, ventilation, and air conditioning (HVAC) units, alternatively referred to as computer room air conditioning (CRAC) units within data center environments and within the present description. The present technology may further reduce a total number of CRAC units needed for a given data center. Additionally, a reduction in the power consumed by internal cooling solutions of the rack components (e.g., internal server fans) may also result from the increased and dedicated rack cooling. Further, by use of drop-down ceiling tile dimensions and leveraging "drop-in" capabilities, the heat-extracting fans may easily replace any existing drop-down ceiling tile and/or light fixture.

Several characteristics of the heat extracting fans may include fan-specific support frame shapes (e.g., a size of a ceiling tile), weight, and power consumption limitations. Additionally, a fan capable of creating a helical resonant cavity may be used to ensure that the warm air is extracted from the rack below in a localized vortex-like manner. Adjustable fan speed and air extraction capabilities allow granular adjustment of each dedicated heat-extracting air column. Fan motor controls with wireless capabilities may improve flexibility of mounting locations for the heat-extracting fans, and would allow on-demand remote access to adjust the parameters of individual fans (e.g., temperature set points, etc.).

It should be noted that the technology described herein may be implemented using a variety of different fan designs, provided a helical resonant cavity (vortex-like airflow) is produced. Two example fan designs that may be utilized to implement the present technology include a Tesla-based laminar vortex fan and Fibonacci-spiral-based fan. It should be noted that other fan technologies and designs may be used, provided the mechanics dictated by the vertical-plane rack cooling is available in the particular implementation. Benchmarking of the air extraction capability of the fan may be performed to assist with selection of a particular fan design for a particular implementation.

Regarding the Tesla-based laminar vortex fan, this fan design utilizes the science of laminar flow between an array of flat disks to move air throughout the environment. The laminar movement of the air around the disks creates a smooth uninterrupted vortex-like airflow capable of creating a helical resonant cavity at the intake of the fan suitable to provide the heated air extraction for vertical plane heat extraction and to achieve the vertical vortex-like airflow for the dedicated server rack cooling described herein.

Further, regarding the Fibonacci-spiral-based fan, this fan design is shaped like a tapered impeller and induces air rotation by physically forcing the air into a tubular vortex. When utilized with the present technology, the tubular vortex may be created above a server rack in a dedicated manner to provide the heated air extraction for vertical plane heat extraction and to achieve the vertical vortex-like airflow for the dedicated server rack cooling described herein.

A temperature sensor is placed at the location where the air enters the fan, and is used to control fan speed and to maintain a pre-set temperature/range. This location-based temperature sensing and temperature range limitation allows individual fans to be controlled to avoid either excessive heating or excessive cooling, both of which may damage certain rack components. The ability to control how much heat is extracted and to adapt to different location-specific temperatures and rack heat-generation variations may further benefit efforts to save energy.

It is noted that variations in the sizes of ceiling tiles may exist in different data centers. As such, the frame of a fan of a suitable dimension may be specified as appropriate for a given implementation. Additionally, it should be noted that the weight of the given fan assembly may be specified also as appropriate for the given implementation, along with any power consumption limitations (e.g., existing current-carrying wiring capacities/ratings).

Additionally, a dedicated heat exchanger may be associated with each heat-extracting fan to allow the heat extracted from the data center to be re-purposed and reused to heat other portions of a building. As an alternative to dedicated heat exchangers, heated air that is extracted from a data center by a set of heat-extracting fans may be combined and passed through a single heat exchanger to allow the heat extracted from the data center to be re-purposed and reused as described above.

As an additional alternative, the cooler air stream that results from the extraction of heat by heat exchanger(s) may be routed to the CRAC unit that cools the data center. As such, the CRAC unit may more efficiently provide cooler air to the data center by use of cooler intake air.

It should be noted that conception of the present subject matter resulted from recognition of certain limitations associated with data center and data server cooling. For example, it was observed that cooling of large data centers and all the server racks and components is conventionally achieved by circulation of cold air forced by a number of computer room air conditioning (CRAC) units. It was further observed that, even with conventional hot-isle/cold-isle arrangements, several factors complicate data center cooling. For example, not all locations/racks produce the same amount of heat, and the heat produced by a given rack is not constant. It was also observed that rack internal cooling fans push air on a horizontal plane (toward the hot isles), and cool air coming from perforated subfloor tiles (and forced/pushed in by the CRAC units) tends to move in a vertical plane for a short distance. It was additionally observed that air is often turbulently-dispersed within the data center due to the effects of the respective cooling fans and due to the differences in temperature between the different air masses in the different hot/cold isles. It was further observed that these interdependent factors create micro-climates that unpredictably affect the cooling of a given rack and make achieving predictable temperatures in key data center locations difficult. Based upon these observations, it was determined that a problem existed with the turbulent air in a data center that results from the horizontal heat exhaust of the server cabinets and the resulting isolation of the heat masses into hot and cold isles (e.g., temperature gradients between the two air masses). In view of the several factors discussed above, it was determined that the new technology as described herein was needed to apply individual cooling controls to individual server cabinets. It was further determined that this new technology should draw server cooling air from the CRAC units entering at the floor tiles through a fan situated at a location of a ceiling tile above the individual server rack. It was further determined that forming a vertical vortex of air around the data servers in the individual server rack that stays in laminar contact with the servers from its floor entry into the data center until its exhaust through a vortex-producing fan situated above the individual server rack may prevent the other factors from causing turbulent airflow in the data center. As such, the new technology as described herein may reduce data center air turbulence and improve data server cooling efficiency. The present subject matter improves data center and data server cooling by providing for server rack-dedicated vertical vortex airflow server cooling, as described above and in more detail below. As such, improved data center and data server cooling may be obtained through use of the present technology.

The server rack-dedicated vertical vortex airflow server cooling described herein may be performed in real time to allow prompt and individualized temperature controls for individual server racks within data centers. For purposes of the present description, real time shall include any time frame of sufficiently short duration as to provide reasonable response time for information processing acceptable to a user of the subject matter described. Additionally, the term "real time" shall include what is commonly termed "near real time"—generally meaning any time frame of sufficiently short duration as to provide reasonable response time for on-demand information processing acceptable to a user of the subject matter described (e.g., within a portion of a second or within a few seconds). These terms, while difficult to precisely define are well understood by those skilled in the art.

FIG. 1 is a block diagram of an example of an implementation of a system 100 for server rack-dedicated vertical vortex airflow server cooling. A data center controller 102 is illustrated and communicates via a network 104 with several other devices. The other devices include a dedicated server temperature control system_1 106 through a dedicated server temperature control system_N 108. Each of the dedicated server temperature control systems 106 through 108 may be associated with a single server rack within a data center, as described in more detail below.

Each of the dedicated server temperature control systems 106 through 108 include a fan input air temperature sensor 110, a vortex-producing fan 112, a vortex-producing fan controller 114, and a heat exchanger 116. Within each of the dedicated server temperature control systems 106 through 108, the respective fan input air temperature sensor 110 measures input air temperature to the respective vortex-producing fan 112 that has been heated by a server rack situated below the respective vortex-producing fan. The vortex-producing fan 112 has a variable speed motor (not shown) that allows individual flow-rate tuning for each vortex-producing fan 112. Each vortex-producing fan controller 114 utilizes fan input air temperature readings from the associated fan input air temperature sensor 110 to determine whether to adjust the operating speed of the respective vortex-producing fan 112. As such, the dedicated server temperature control systems 106 through 108 operate to "self tune" server cooling needs for the respective server rack to which they are dedicated.

The respective heat exchanger 116 operates to extract heat from heated air that is pulled from the data center by the associated fan under control of the respective vortex-producing fan controller 114. The heated air may be passed through the respective heat exchanger 116 to either re-purpose and reuse the extracted heat, or to exhaust the extracted heat through other thermodynamic contacts, such as in-ground heat sinks or other forms of heat distribution.

A computer room air conditioning (CRAC) unit 118 is also illustrated and may also be controlled by the data center controller 102. As described above, data center exhaust air that is cooled by the heat exchangers 116 may be passed to the CRAC unit 118 to provide a lower input air temperature and starting point for operation of the CRAC unit 118.

As will be described in more detail below in association with FIG. 2 through FIG. 5, the data center controller 102 and the respective vortex-producing fan controllers 114 may each provide automated server rack-dedicated vertical vortex airflow server cooling. As such, the present technology may be implemented at a centralized controller level or at a distributed controller level. A variety of possibilities exist for implementation of the present subject matter, and all such possibilities are considered within the scope of the present subject matter.

The functionality described herein may be distributed between the data center controller 102 and the respective vortex-producing fan controllers 114, as appropriate for a given implementation. The automated server rack-dedicated vertical vortex airflow server cooling is based upon dedicated control of a vortex-producing exhaust fan in association with each server rack. Input air temperature to a vortex-producing exhaust fan is measured and individual operating speeds of the respective exhaust fans may be adjusted to individually tune the vortex airflow associated with each server rack based upon the individual amount of heat produced by the respective server rack.

The network 104 may include any form of interconnection suitable for the intended purpose, including a private or public network such as an intranet or the Internet, respectively, direct inter-module interconnection, dial-up, wireless, or any other interconnection mechanism capable of interconnecting the respective devices.

Figure 2:
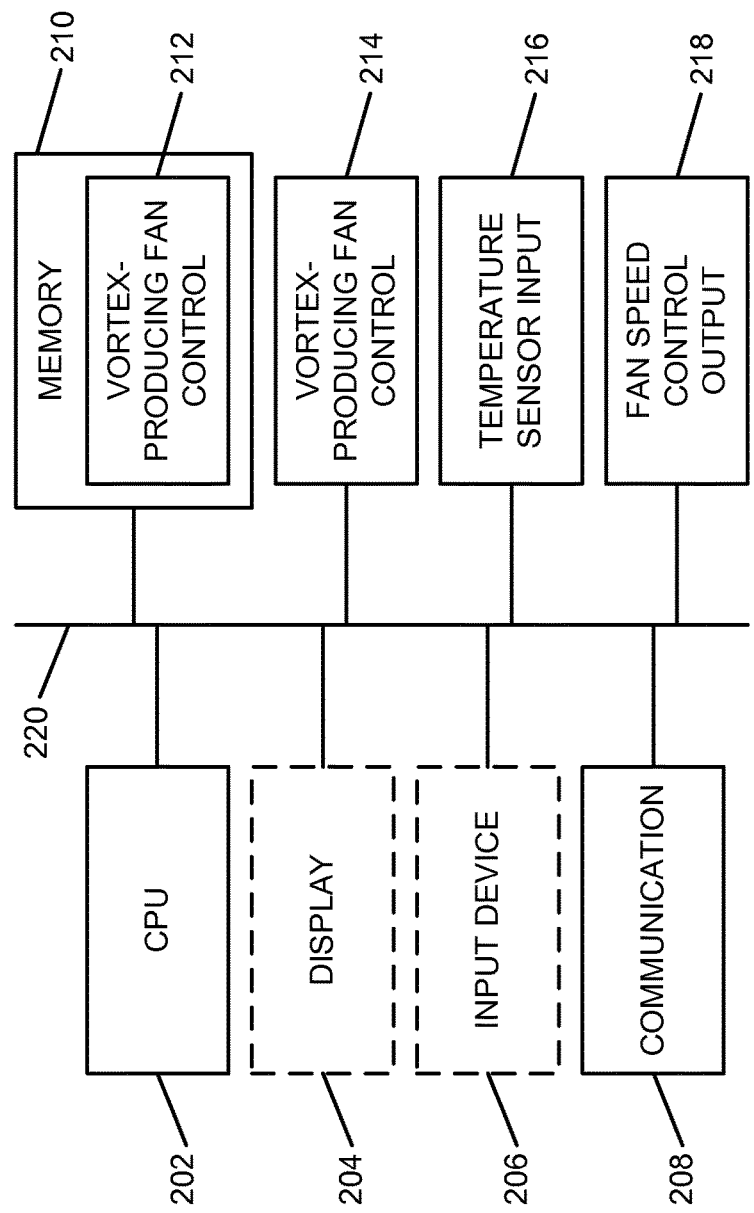
FIG. 2 is a block diagram of an example of an implementation of a core processing module capable of performing server rack-dedicated vertical vortex airflow server cooling according to an embodiment of the present subject matter.

FIG. 2 is a block diagram of an example of an implementation of a core processing module 200 capable of performing server rack-dedicated vertical vortex airflow server cooling. The core processing module 200 may be associated with the data center controller 102 and the respective vortex-producing fan controllers 114, as appropriate for a given implementation. As such, the core processing module 200 is described generally herein, though it is understood that many variations on implementation of the components within the core processing module 200 are possible and all such variations are within the scope of the present subject matter.

Further, the core processing module 200 may provide different and complementary processing of server rack-dedicated vertical vortex airflow server cooling in association with each implementation. As such, for any of the examples below, it is understood that any aspect of functionality described with respect to any one device that is described in conjunction with another device (e.g., sends/sending, etc.) is to be understood to concurrently describe the functionality of the other respective device (e.g., receives/receiving, etc.).

A central processing unit (CPU) 202 ("processor") provides hardware that performs computer instruction execution, computation, and other capabilities within the core processing module 200. A display 204 provides visual information to a user of the core processing module 200 and an input device 206 provides input capabilities for the user.

The display 204 may include any display device, such as a cathode ray tube (CRT), liquid crystal display (LCD), light emitting diode (LED), electronic ink displays, projection, touchscreen, or other display element or panel. The input device 206 may include a computer keyboard, a keypad, a mouse, a pen, a joystick, touchscreen, voice command processing unit, or any other type of input device by which the user may interact with and respond to information on the display 204.

It should be noted that the display 204 and the input device 206 are illustrated with a dashed-line representation within FIG. 2 to indicate that they may be optional components for the core processing module 200 for certain implementations/devices, or may be located remotely from the respective devices and hosted by another computing device that is in communication with the respective devices. Accordingly, the core processing module 200 may operate as a completely automated embedded device without direct user configurability or feedback. However, the core processing module 200 may also provide user feedback and configurability via the display 204 and the input device 206, respectively, as appropriate for a given implementation.

A communication module 208 provides hardware, protocol stack processing, and interconnection capabilities that allow the core processing module 200 to communicate with other modules within the system 100. The communication module 208 may include any electrical, protocol, and protocol conversion capabilities useable to provide interconnection capabilities, appropriate for a given implementation.

A memory 210 includes a vortex-producing fan control storage area 212 that stores temperature input readings and speed control parameters within the core processing module 200. As described above, the core processing module 200 may be implemented in each of the data center controller 102 and the respective vortex-producing fan controllers 114. As such, the values stored in the vortex-producing fan control storage area 212 may be values associated with control of all vortex-producing fans in a data center or for a specific dedicated fan that is under control, respectively, as appropriate for a given implementation.

It is understood that the memory 210 may include any combination of volatile and non-volatile memory suitable for the intended purpose, distributed or localized as appropriate, and may include other memory segments not illustrated within the present example for ease of illustration purposes. For example, the memory 210 may include a code storage area, an operating system storage area, a code execution area, and a data area without departure from the scope of the present subject matter.

A vortex-producing fan control module 214 is also illustrated. The vortex-producing fan control module 214 provides vortex-producing fan control operations for the core processing module 200, as described above and in more detail below. The vortex-producing fan control module 214 implements the automated server rack-dedicated vertical vortex airflow server cooling of the core processing module 200. As also described above, the core processing module 200 may be implemented in each of the data center controller 102 and the respective vortex-producing fan controllers 114. As such, the vortex-producing fan control module 214 may control all vortex-producing fans in a data center or a specific dedicated fan that is under control, respectively, as appropriate for a given implementation.

It should also be noted that the vortex-producing fan control module 214 may form a portion of other circuitry described without departure from the scope of the present subject matter. Further, the vortex-producing fan control module 214 may alternatively be implemented as an application stored within the memory 210. In such an implementation, the vortex-producing fan control module 214 may include instructions executed by the CPU 202 for performing the functionality described herein. The CPU 202 may execute these instructions to provide the processing capabilities described above and in more detail below for the core processing module 200. The vortex-producing fan control module 214 may form a portion of an interrupt service routine (ISR), a portion of an operating system, a portion of a browser application, or a portion of a separate application without departure from the scope of the present subject matter.

A temperature sensor input 216 may receive fan input air temperature readings from the air entering one of the fan input air temperature sensors 110. The fan input air temperature readings may be used by the vortex-producing fan control module 214 to control the fan speed of the dedicated vortex-producing fan 112 by use of a fan speed control output 218.

For an alternative implementation where the data center controller 102 controls all vortex-producing fans in a data center, the vortex-producing fan control module 214 of the respective vortex-producing fan controllers 114 may read the respective fan input air temperature readings from the associated fan input air temperature sensor 110, and may transmit the readings to the vortex-producing fan control module 214 that operates in association with a core processing module 200 of the data center controller 102. Additionally, in such an implementation, the vortex-producing fan control module 214 of the core processing module 200 of the data center controller 102 may then transmit fan control parameters to the vortex-producing fan control module 214 of the respective vortex-producing fan controllers 114 to allow the fan controllers to control the fan speed of the dedicated vortex-producing fan 112 by use of the fan speed control output 218.

The CPU 202, the display 204, the input device 206, the communication module 208, the memory 210, the vortex-producing fan control module 214, the temperature sensor input 216, and the fan speed control output 218 are interconnected via an interconnection 220. The interconnection 220 may include a system bus, a network, or any other interconnection capable of providing the respective components with suitable interconnection for the respective purpose.

Though the different modules illustrated within FIG. 2 are illustrated as component-level modules for ease of illustration and description purposes, it should be noted that these modules may include any hardware, programmed processor(s), and memory used to carry out the functions of the respective modules as described above and in more detail below. For example, the modules may include additional controller circuitry in the form of application specific integrated circuits (ASICs), processors, antennas, and/or discrete integrated circuits and components for performing communication and electrical control activities associated with the respective modules. Additionally, the modules may include interrupt-level, stack-level, and application-level modules as appropriate. Furthermore, the modules may include any memory components used for storage, execution, and data processing for performing processing activities associated with the respective modules. The modules may also form a portion of other circuitry described or may be combined without departure from the scope of the present subject matter.

Additionally, while the core processing module 200 is illustrated with and has certain components described, other modules and components may be associated with the core processing module 200 without departure from the scope of the present subject matter. Additionally, it should be noted that, while the core processing module 200 is described as a single device for ease of illustration purposes, the components within the core processing module 200 may be co-located or distributed and interconnected via a network without departure from the scope of the present subject matter. For a distributed arrangement, the display 204 and the input device 206 may be located at a point of sale device, kiosk, or other location, while the CPU 202 and memory 210 may be located at a local or remote server. Many other possible arrangements for components of the core processing module 200 are possible and all are considered within the scope of the present subject matter. Accordingly, the core processing module 200 may take many forms and may be associated with many platforms.

Figure 3:
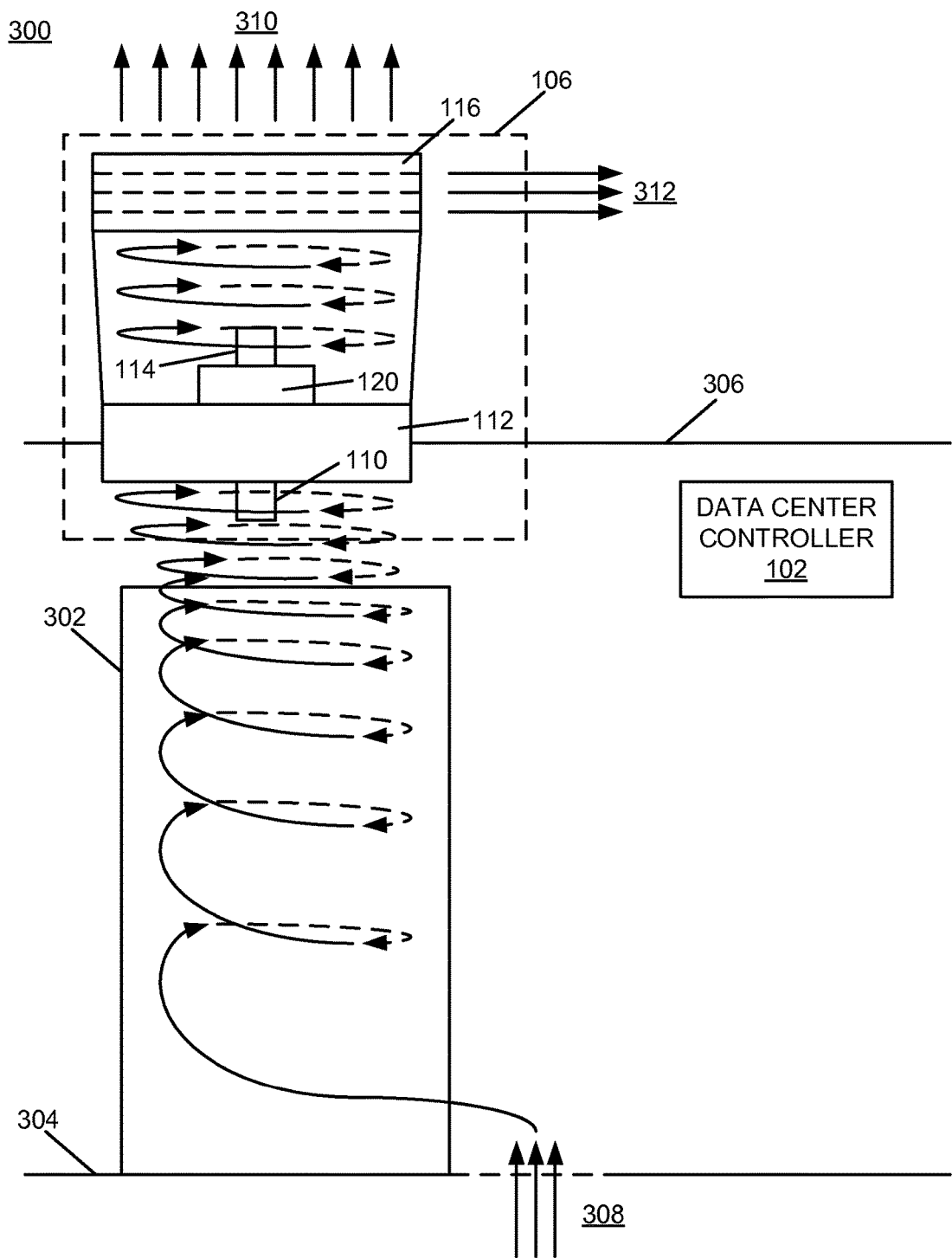
FIG. 3 is an illustration of an example of an implementation of a portion of a data center for providing server rack-dedicated vertical vortex airflow server cooling according to an embodiment of the present subject matter.

FIG. 3 is an illustration of an example of an implementation of a portion of a data center 300 for providing server rack-dedicated vertical vortex airflow server cooling. It should be noted that the elements in FIG. 3 are not drawn to any scale, and are provided at the respective sizes for ease of representation within the drawing. Further, any conduit and ductwork are not illustrated to reduce complexity in the drawing figure.

A server rack 302 is illustrated from a side view perspective and is shown to be situated above a suspended floor 304 of the data center 300. Individual servers within the server rack 302 are not illustrated to also reduce complexity in the drawing figure. However, it is understood that room for airflow within the server rack 302 around the servers is provided by the arrangement of the server rack 302 and the servers therein.

A drop ceiling 306 is located above the server rack 302. The dedicated server temperature control system_1 106 from FIG. 1 is again illustrated, along with the associated fan input air temperature sensor 110, vortex-producing fan 112, vortex-producing fan controller 114, and heat exchanger 116. The vortex-producing fan 112 is shown to include a variable-speed fan motor 120 that may provide variable-speed rotation of the vortex-producing fan 112. The variable-speed fan motor 120 may be operated under the control of the vortex-producing fan controller 114 to adjust the speed of the vortex-producing fan 112 and thereby a rate of airflow through the server rack 302. As such, the vortex-producing fan 112 represents a variable-speed vortex-producing fan for purposes of the present description.

As described above, the vortex producing fan 112 under operation may produce a helical resonant cavity (vortex) airflow when running. The strength of the helical resonant cavity (vortex) airflow may be varied with the operational speed of the vortex producing fan 112 as controlled by the vortex-producing fan controller 114. As represented by the arrows 308, cool air from the CRAC unit 118 (not shown) may enter below the server rack 302 through a perforated floor tile of the suspended floor 304. The cool air may be drawn into and coupled with the vortex created by the dedicated vortex producing fan 112 above the server rack 302. This coupling of airflows is shown by the helical airflow represented within the server rack 302.

The dedicated server temperature control system_1 106 is shown mounted within a ceiling tile location for purposes of the present example. However, it is understood that the dedicated server temperature control system_1 106 may be located prior to installation of the drop ceiling 306, and may be positioned to maximize interaction and coupling of the vortex that is created by the dedicated vortex producing fan 112 above the server rack 302 with cold air that enters from the suspended floor 304 of the data center.

As also described above, the vortex airflow created by the vortex producing fan 112 may extract heated air directly from the server rack 302 under the control of the dedicated server temperature control system_1 106. This extracted heated air may be forced through the heat exchanger 116 and reusable heat may be re-purposed and reused, or may be exhausted from the data center, as represented by the arrows 310. Cooled air from the heat extractor 116, as represented by the arrows 312, may be returned to the air intake of the CRAC unit 118 (not shown), or may be exhausted from the data center, as appropriate for a given implementation.

It should be noted that while the dedicated heat exchanger 116 is illustrated as part of the dedicated server temperature control system_1 106, a centralized heat exchanger may alternatively be implemented, as appropriate for a given implementation. For a centralized heat exchanger implementation, extracted heated exhaust air from multiple dedicated server temperature control systems may be routed by duct work or otherwise through the centralized heat exchanger.

The data center controller 102 is also illustrated within the data center 300. The data center controller 102 may be located at any location within or associated with a data center, such as the data center 300, as appropriate for a given implementation.

As described above, the dedicated server temperature control system_1 106 may communicate with the data center controller 102 wirelessly or by other connectivity. As one possible implementation, the data center controller 102 may operate as a centralized controller device for multiple dedicated server temperature control systems (others not illustrated in FIG. 3). In this type of implementation, the respective dedicated server temperature control systems may send fan input air temperature readings to the data center controller 102 and the data center controller 102 may analyze the data from multiple dedicated server temperature control systems and may provide instructions to each dedicated system to adjust the input air temperature of the air entering the variable-speed vortex-producing fan under the control of the respective dedicated system to further adjust the temperatures of distributed server racks. In response to the instructions, the respective dedicated server temperature control systems may adjust the speed of the variable-speed vortex-producing fan based upon the instructed adjustment of the input air temperature of the air entering the variable-speed vortex-producing fan. The respective dedicated server temperature control systems may confirm the instructed adjustment of the input air temperature of the air entering the variable-speed vortex-producing fan using additional readings from the fan input air temperature sensor positioned above the server rack, and may send a confirmation of the instructed adjustment of the input air temperature of the air entering the variable-speed vortex-producing fan to the data center controller 102.

Alternatively, the dedicated server temperature control systems may autonomously control the temperature characteristics of the respective server rack to which they are dedicated. In such an implementation, the dedicated server temperature control systems may be provisioned with a specified fan input air temperature range, and may "self tune" heat extraction from the server rack to which it is dedicated. The dedicated server temperature control systems may maintain the input air temperature of the air entering the variable-speed vortex-producing fan within a specified fan input air temperature range, and thereby the server rack may coincidentally be maintained within a specified server rack temperature range.

It should further be noted that, under either implementation, temperature adjustments by use of adjustments to the speed of the variable-speed vortex-producing fan may be performed by iteratively adjusting the speed of the variable-speed vortex-producing fan using the readings from the fan input air temperature sensor positioned above the server rack until the input air temperature of the air entering the variable-speed vortex-producing fan is within a specified temperature range.

Figure 4:
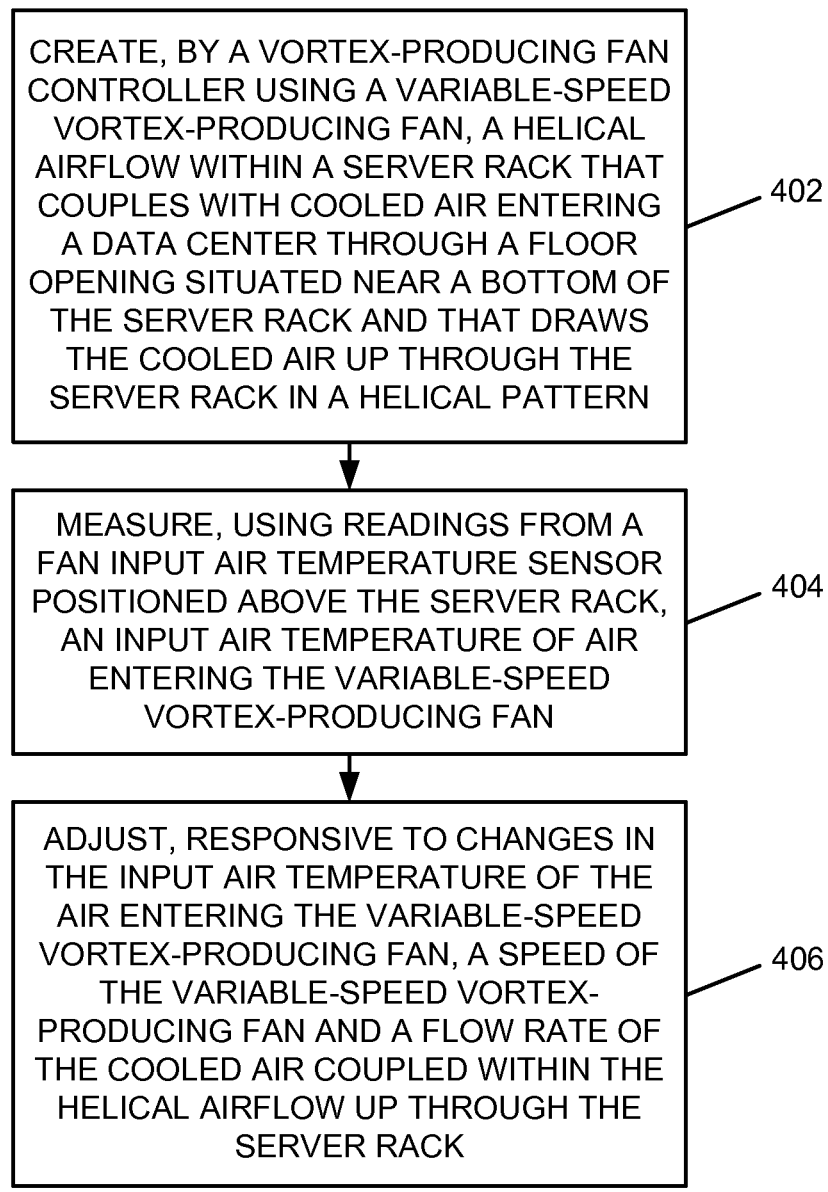
FIG. 4 is a flow chart of an example of an implementation of a process for server rack-dedicated vertical vortex airflow server cooling according to an embodiment of the present subject matter.
Figure 5:
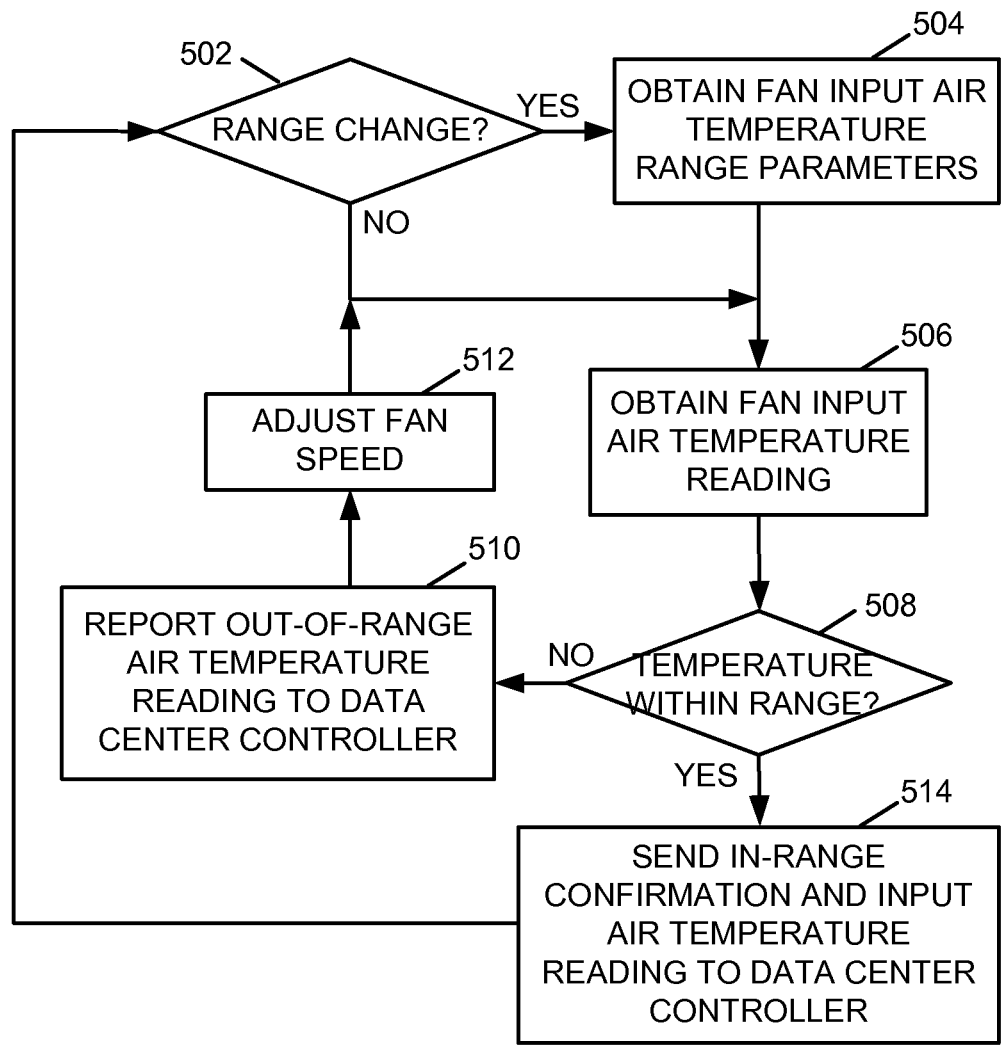
FIG. 5 is a flow chart of an example of an implementation of a process that iteratively performs server rack-dedicated vertical vortex airflow server cooling according to an embodiment of the present subject matter.

FIG. 4 through FIG. 5 described below represent example processes that may be executed by devices, such as the core processing module 200, to perform the automated server rack-dedicated vertical vortex airflow server cooling associated with the present subject matter. Many other variations on the example processes are possible and all are considered within the scope of the present subject matter. The example processes may be performed by modules, such as the vortex-producing fan control module 214 and/or executed by the CPU 202, associated with such devices. It should be noted that time out procedures and other error control procedures are not illustrated within the example processes described below for ease of illustration purposes. However, it is understood that all such procedures are considered to be within the scope of the present subject matter. Further, the described processes may be combined, sequences of the processing described may be changed, and additional processing may be added or removed without departure from the scope of the present subject matter.

FIG. 4 is a flow chart of an example of an implementation of a process 400 for server rack-dedicated vertical vortex airflow server cooling. At block 402, the process 400 creates, by a vortex-producing fan controller using a variable-speed vortex-producing fan, a helical airflow within a server rack that couples with cooled air entering a data center through a floor opening situated near a bottom of the server rack and that draws the cooled air up through the server rack in a helical pattern. At block 404, the process 400 measures, using readings from a fan input air temperature sensor positioned above the server rack, an input air temperature of air entering the variable-speed vortex-producing fan. At block 406, the process 400 adjusts, responsive to changes in the input air temperature of the air entering the variable-speed vortex-producing fan, a speed of the variable-speed vortex-producing fan and a flow rate of the cooled air coupled within the helical airflow up through the server rack.

FIG. 5 is a flow chart of an example of an implementation of a process 500 that iteratively performs server rack-dedicated vertical vortex airflow server cooling. For purposes of the present example, it is presumed that a variable-speed vortex-producing fan, such as the vortex-producing fan 112, is already started and that a helical airflow within a server rack that couples into the helical airflow cooled air entering a data center through a floor opening situated near a bottom of the server rack and that draws the cooled air up through the server rack in a helical pattern has already been created, as described above in association with FIG. 4. It should further be noted that the processing described in association with the process 500 may be performed at any of the dedicated server temperature control system_1 106 through the dedicated server temperature control system_N 108. As described above, a data center controller, such as the data center controller 102, may specify fan input air temperature ranges for individual dedicated server temperature control systems, and the respective control systems may adjust the speed of the variable-speed vortex-producing fan and the flow rate of the cooled air coupled within the helical airflow up through the server rack responsive to instructions from a data center controller. Alternatively, the respective control systems may autonomously-regulate heat extraction from the server rack using specified fan input air temperature ranges and may change the specified temperature ranges as appropriate for a given set of operating circumstances. As such, the process 500 as described is understood to embody both forms of operation of a dedicated server temperature control system.

At decision point 502, the process 500 begins iterative processing to adjust the flow rate of cooled air coupled within the helical airflow through the server cabinet by initially determining if a fan input air temperature range change has been established. A change to the fan input air temperature range may be established, for example, responsive to instructions from a data center controller, such as the data center controller 102. In response to determining that a fan input air temperature range change has been established, the process 500 obtains fan input air temperature range parameters at block 504. For example, the process 500 may obtain high and low fan input air temperature boundaries.

In response to obtaining the fan input air temperature range parameters at block 504, or in response to determining at decision point 502 that a fan input air temperature range change has not been established, the process 500 obtains a fan input air temperature reading at block 506. The fan input air temperature reading may be obtained as a measured temperature reading from a fan input air temperature sensor, such as the fan input air temperature sensor 110.

At decision point 508, the process 500 makes a determination as to whether the obtained/measured fan input air temperature reading is within the specified fan input air temperature range. In response to determining that the fan input air temperature reading is not within the specified fan input air temperature range, the process 500 reports the out-of-range temperature reading to the data center controller at block 510. At block 512, the process 500 adjusts the speed of the variable-speed vortex-producing fan. The adjustment may be an increase in speed or a decrease in speed depending upon the measured fan input air temperature. As described above, maintaining the server rack within a specified server rack temperature range avoids excessive heating or excessive cooling of the servers within the server rack. As such, the process 500 infers the server rack temperature from the fan input air temperature reading. Maintaining the input air temperature of the air entering the variable-speed vortex-producing fan within the specified fan input air temperature range thereby maintains the server rack within its specified server rack temperature range. The process 500 returns to block 506 to obtain another fan input air temperature reading, and iterates as described above.

Returning to the description of decision point 508, in response to determining that the obtained/measured fan input air temperature reading is within the specified fan input air temperature range, the process 500 sends an in-range confirmation and the temperature reading to the data center controller at block 514. The process 500 returns to decision point 502 and iterates as described above. It should be noted that the data center controller may determine to adjust the fan input air temperature range responsive to changes in server configurations within the data center or for other purposes. As such, the return to decision point 502 and the iterative processing to continually adjust based upon dynamic fan input air temperature ranges allows for efficient control of individual server rack cooling for each server rack within a data center. The processing at block 504 may include receiving instructions to adjust the input air temperature of the air entering the variable-speed vortex-producing fan from the data center controller responsive to sending input air temperature readings to a data center controller, such as at block 514. Further, the speed adjustment of the variable-speed vortex producing fan performed at block 512 may thereby be performed based upon the instructed adjustment of the input air temperature of the air entering the variable-speed vortex-producing fan received from the data center controller. The determination at decision point 508 may include confirming the instructed adjustment of the input air temperature of the air entering the variable-speed vortex-producing fan using additional readings at block 506 from the fan input air temperature sensor positioned above the server rack. Additionally, the in-range confirmation sent to the data center controller at block 514 may include sending a confirmation of the instructed adjustment of the input air temperature of the air entering the variable-speed vortex-producing fan to the data center controller.

As such, the process 500 iteratively adjusts the speed of the variable-speed vortex-producing fan using the readings from the fan input air temperature sensor positioned above the server rack until the input air temperature of the air entering the variable-speed vortex-producing fan is within a specified fan input air temperature range. The process 500 additionally maintains the input air temperature of the air entering the variable-speed vortex-producing fan within the specified fan input air temperature range, and the server rack may coincidentally be maintained within a specified server rack temperature range. The specified temperature range may be modified over time as appropriate for a given implementation, either by the data center controller or by the dedicated server temperature control system.

As described above in association with FIG. 1 through FIG. 5, the example systems and processes provide server rack-dedicated vertical vortex airflow server cooling. Many other variations and additional activities associated with server rack-dedicated vertical vortex airflow server cooling are possible and all are considered within the scope of the present subject matter.

Those skilled in the art will recognize, upon consideration of the above teachings, that certain of the above examples are based upon use of a programmed processor, such as the CPU 202. However, the invention is not limited to such example embodiments, since other embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art based upon the teachings herein without departing from the scope and spirit of the invention. The subject matter was described to explain the principles of the invention and the practical application, and to enable others of ordinary skill in the art to understand the invention for various embodiments with various modifications as are suited to the particular use contemplated.

What is claimed is:

1. A method, comprising:
   creating, by a vortex-producing fan controller using a variable-speed vortex-producing fan situated above a server rack, a helical airflow within the server rack that couples with cooled air entering a data center through a floor opening situated near a bottom of the server rack and that draws the cooled air up through the server rack in a helical pattern;
   measuring, using readings from a fan input air temperature sensor positioned above the server rack, an input air temperature of air entering the variable-speed vortex-producing fan; and
   adjusting, responsive to changes in the input air temperature of the air entering the variable-speed vortex-producing fan, a speed of the variable-speed vortex-producing fan and a flow rate of the cooled air coupled within the helical airflow up through the server rack.

2. The method of claim 1, further comprising maintaining the input air temperature of the air entering the variable-speed vortex-producing fan from the server rack within a specified fan input air temperature range, where the server rack is coincidentally maintained within a specified server rack temperature range.

3. The method of claim 1, where the vortex-producing fan controller comprises a server rack-dedicated vortex-producing fan controller that autonomously regulates heat extraction from the server rack.

4. The method of claim 1, where the vortex-producing fan controller comprises a server rack-dedicated vortex-producing fan controller that adjusts the speed of the variable-speed vortex-producing fan and the flow rate of the cooled air coupled within the helical airflow as drawn up through the server rack responsive to instructions from a data center controller.

5. The method of claim 1, further comprising:
sending input air temperature readings to a data center controller;
receiving, from the data center controller, instructions to adjust the input air temperature of the air entering the variable-speed vortex-producing fan from the server rack; and
where adjusting, responsive to the changes in the input air temperature of the air entering the variable-speed vortex-producing fan, the speed of the variable-speed vortex-producing fan and the flow rate of the cooled air coupled within the helical airflow up through the server rack comprises:
adjusting the speed of the variable-speed vortex-producing fan based upon the instructed adjustment of the input air temperature of the air entering the variable-speed vortex-producing fan from the server rack.

6. The method of claim 5, further comprising:
confirming the instructed adjustment of the input air temperature of the air entering the variable-speed vortex-producing fan from the server rack using additional input air temperature readings from the fan input air temperature sensor positioned above and between the server rack and the variable-speed vortex-producing fan; and
sending a confirmation of the instructed adjustment of the input air temperature of the air entering the variable-speed vortex-producing fan from the server rack to the data center controller.

7. The method of claim 1, where adjusting, responsive to the changes in the input air temperature of the air entering the variable-speed vortex-producing fan, the speed of the variable-speed vortex-producing fan and the rate of cooled airflow up through the server rack comprises:
iteratively adjusting the speed of the variable-speed vortex-producing fan using input air temperature readings from the fan input air temperature sensor positioned above and between the server rack and the variable-speed vortex-producing fan until the input air temperature of the air entering the variable-speed vortex-producing fan from the server rack is within a specified fan input air temperature range.

* * * * *